United States Patent [19]
Tsubota

[11] Patent Number: 5,807,118
[45] Date of Patent: Sep. 15, 1998

[54] IC SOCKET

[75] Inventor: Eisaku Tsubota, Kawasaki, Japan

[73] Assignee: Yamaichi Electronics Co., Ltd., Tokyo, Japan

[21] Appl. No.: 775,198

[22] Filed: Dec. 30, 1996

[30] Foreign Application Priority Data

Dec. 28, 1995 [JP] Japan .................................. 7-353190

[51] Int. Cl.⁶ .................................................. H01R 9/09
[52] U.S. Cl. .................................. 439/73; 439/331
[58] Field of Search ................................ 439/73, 331

[56] References Cited

U.S. PATENT DOCUMENTS 4,758,176  7/1988  Abe et al. ................................ 439/331
5,244,404  9/1993  Kishi et al. ............................. 439/331
5,312,267  5/1994  Matsuoka et al. ...................... 439/331

FOREIGN PATENT DOCUMENTS

3-68513  10/1991  Japan .

*Primary Examiner*—Neil Abrams
*Assistant Examiner*—T. C. Patel
*Attorney, Agent, or Firm*—Wenderoth, Lind & Ponack, L.L.P.

[57] ABSTRACT

An IC socket in which a presser cover is closed with respect to a socket body, and a body or leads of an IC loaded in the socket body are pressed by an IC pressing member attached to the presser cover so as to be contacted under pressure with contacts of the socket body. The IC pressing member and the presser cover are attached together through a resiliently engageable resilient engagement mechanism.

27 Claims, 13 Drawing Sheets

IC SOCKET

BACKGROUND OF THE INVENTION

1. Field of the Invention

This invention relates to an IC socket, in which an IC presser cover is closed with respect to a socket body, so that an IC loaded in the socket body is contacted under pressure with contacts of the socket body.

2. Brief Description of the Prior Art

In Japanese Patent Publication No. 68513/1991, there is disclosed an IC socket in which a presser cover is closed with respect to a socket body, and leads of an IC are pressed by an IC pressing member adjustably mounted on the presser cover so as to be contacted under pressure with contacts of the socket body.

In the above IC socket, the pressing member is capable of obtaining a proper pressing attitude with respect to the leads projecting sidewardly from two or four opposing sides of the IC body due to self-adjusting action.

The IC pressing member is widely used because of the advantages mentioned above. However, from the standpoint of users, it is demanded that the construction becomes more simple and the assembling made easier.

Furthermore, the IC pressing member inevitably becomes worn. If the IC pressing member becomes overly worn, reliable physical contact is difficult to obtain. Therefore, improvement in this respect is demanded.

The present invention has been accomplished in view of the above situation.

SUMMARY OF THE INVENTION

It is, therefore, an object of the present invention to provide an IC socket which is simple in construction and easy to assemble.

Another object of the invention is to provide an IC socket which ensures reliable physical contact.

A further object of the invention is to provide an IC socket which can be manufactured at a low cost.

In order to achieve the above objects, there is essentially provided an IC socket in which a presser cover is closed with respect to a socket body, and a body or leads of an IC loaded in the socket body are pressed by an IC pressing member attached to the presser cover so as to be contacted under pressure with contacts of the socket body, the IC pressing member and the presser cover being attached together through a resiliently engageable resilient engagement mechanism.

The resilient engagement mechanism preferably includes a recess formed in the presser cover and a projection formed on each of opposite side surfaces of the IC pressing member in such a way as to be able to resiliently engage in the recess.

It is also preferred that a basal end of the projection projects from an outer surface of a cantilever resilient support piece joined to a side surface of the IC pressing member.

Various advantages and features which characterize the present invention are pointed out with particularity in the claims annexed hereto. However, for a better understanding of the present invention, its advantages, and objects attained by its use, reference should be had to drawings and to the accompanying descriptive manner, in which there is illustrated and described preferred embodiments of the present invention.

DETAILED DESCRIPTION OF THE PREFERRED EMBODIMENTS

Several preferred embodiments of the present invention will now be described in detail with reference to the accompanying drawings.

Figure 1:
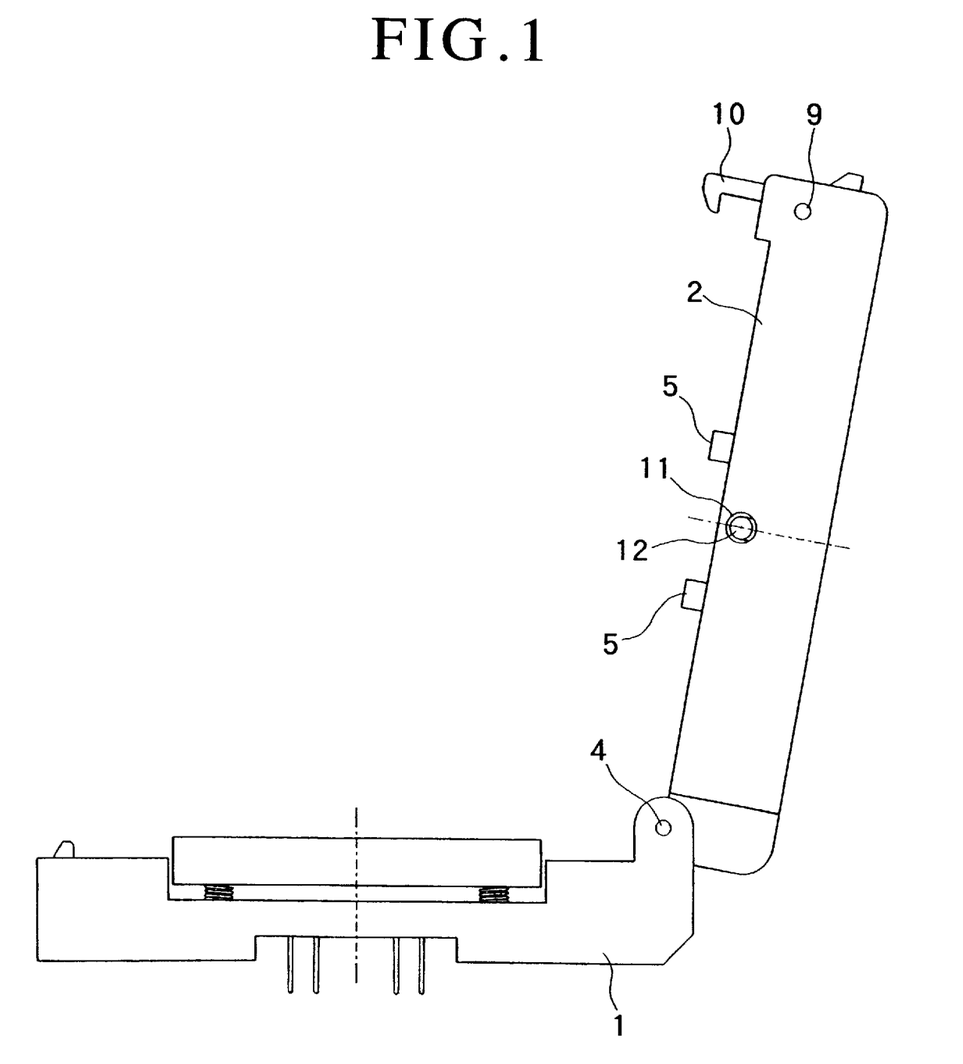
FIG. 1 is a side view of an IC socket according to one preferred embodiment of the present invention.
Figure 2:
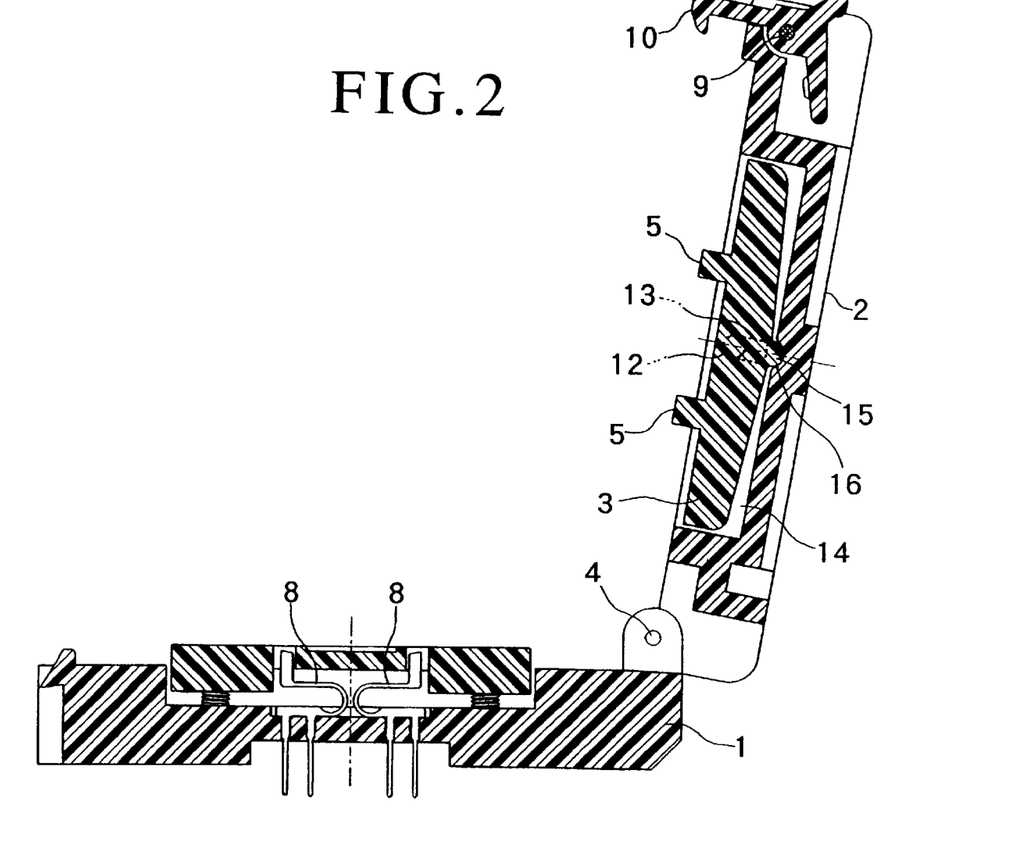
FIG. 2 is a sectional view of FIG. 1.
Figure 3:
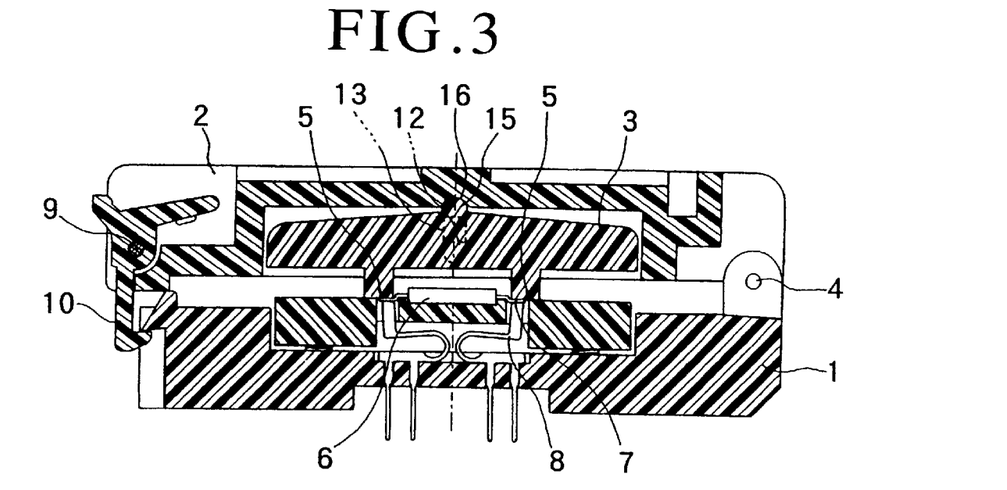
FIG. 3 is a sectional view of the IC socket in which an IC is in a contact state.
Figure 4:
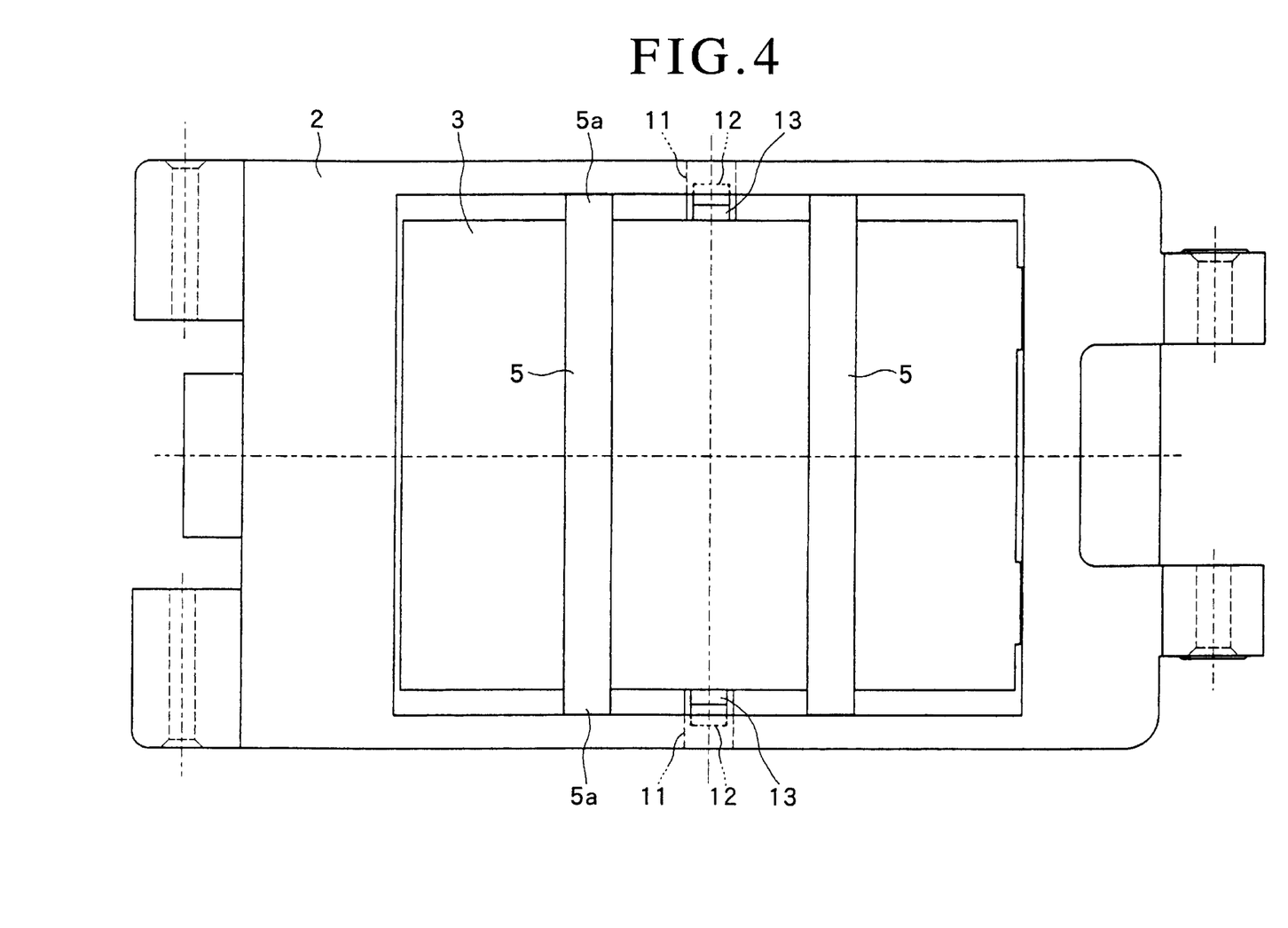
FIG. 4 is a plan view showing an assembled state of a pressing member and an IC presser cover in the IC socket.

As shown in FIGS. 1, 2 and 3, an IC socket has an IC presser cover 2 made of an insulative material, pivotally openably and closably supported by one end of a socket body 1 made of an insulative material through a pin 4. A pressing member 3 made of a separate part from the presser cover 2 is integrally formed of an insulative material and attached to the presser cover 2.

The pressing member 3 has pressing pads 5 integrally molded and projecting from a lower surface of the pressing member 3. When the presser cover 2 is pivoted about the pin 4 and closed with respect to the socket body 1, the pressing pads 5 press an upper surface the IC body 6 loaded in the socket body 1 or upper surfaces of the leads 7 projecting sidewardly of the IC body 6, such that the leads 7, which overlie and contact the contacts 8 of the socket body 1, are urged against the contacts 8. The IC body 6 and leads 7 can together be referred to as an IC package.

When pressed by the pressing pads 5, the contacts 8 are flexed against resiliency and are contacted under pressure with the leads 7 by restoring resiliency thereof. This pressure contact can be retained by bringing a lock member 10 pivotally supported on a free end of the presser cover 2 closed with respect to the socket body 1 through a pin 9. This lock member 10 may be mounted on one end portion of the socket body so that it can engage an end portion of presser cover 2.

As shown in FIGS. 2 and 3, the IC pressing member 3 is adjustably pivotally supported with respect to the presser cover 2 in the pressing direction by a pivotal support means. In this pivotal support means, a pin portion disposed at a central portion of the IC pressing member 3, as one example, a pin portion 15 disposed at a central portion of the upper surface of the IC pressing member 3, is removably slidingly fitted to a bearing portion 16 disposed on the presser cover 2, so that a lever motion can be made about the pin portion 15.

The pin portion 15 is formed of a rib of a decayed circle, having a semi-circular configuration in section. This rib is integrally formed on the upper surface of the pressing member 3 in such a way as to project from the central portion of the upper surface of the pressing member 3. On the other hand, a groove portion of a decayed circle, having a semi-circular configuration in section, is formed in an inner bottom surface of a pressing member receiving portion 14 of the pressing cover 3. By slidingly-fitting the decayed-circle rib into the decayed-circle groove portion, a pivotal support point of the pressing member 3 with respect to the presser cover 2 (i.e., an adjusting support point with respect to the IC) is formed. The pressing pads 5 for pressing the IC leads 7 or the IC body 6 are disposed on lower surfaces of the end portions of the pressing member 3 symmetrically extending leftwardly and rightwardly from this support point.

It may be designed such that the presser cover 2 is not pivotally connected to the socket body 1 and formed of a separate part, so that the IC can be pressed by closing the presser cover 2.

As described in the foregoing, in an IC socket in which a presser cover 2 is closed with respect to a socket body 1, and a body 6 or leads 7 of an IC loaded in the socket body 1 are pressed by an IC pressing member 3 attached to the presser cover 2 so as to be contacted under pressure with contacts 8 of the socket body 1, the IC pressing member 3 and the presser cover 2 are attached together through a resiliently engageable resilient engagement mechanism.

Figure 8:
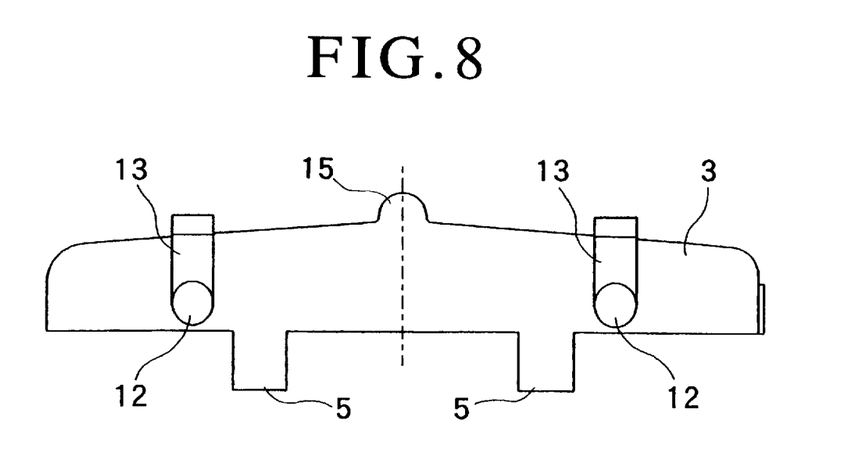
FIG. 8 is a side view of an IC pressing member showing a second preferred embodiment of a resilient engagement mechanism in the IC pressing member.
Figure 9:
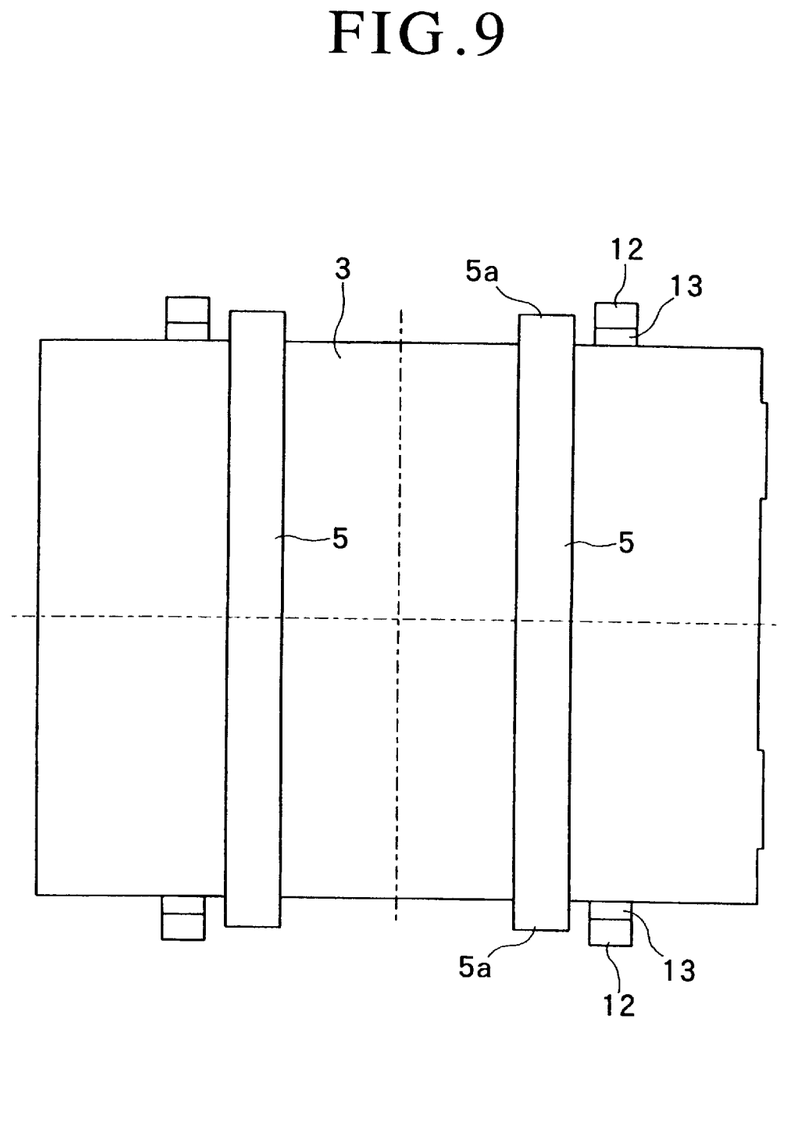
FIG. 9 is a plan view showing the pressing member of FIG. 8.
Figure 10:
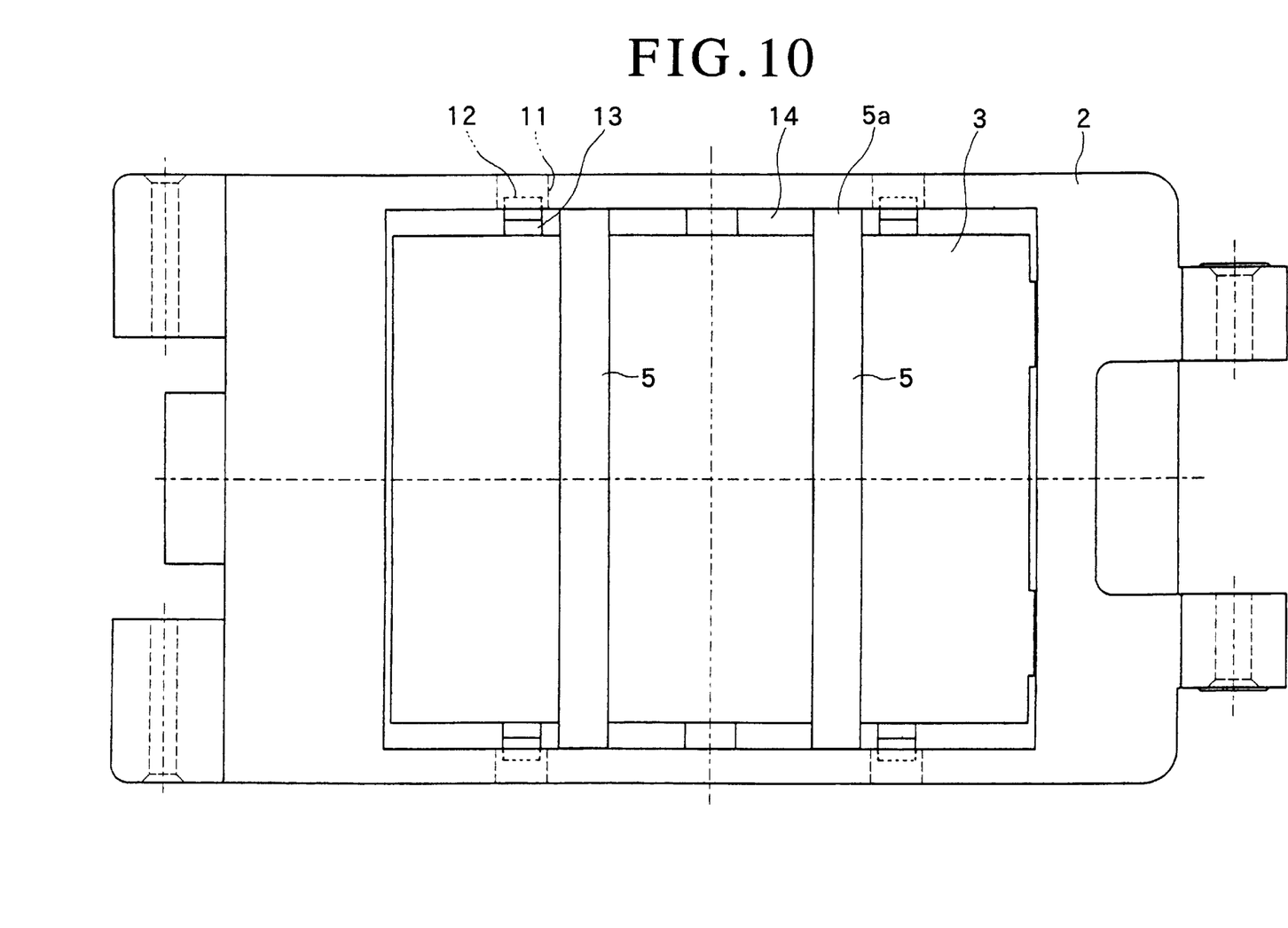
FIG. 10 is a plan view showing an assembled state of the IC pressing member and the IC presser cover.
Figure 11:
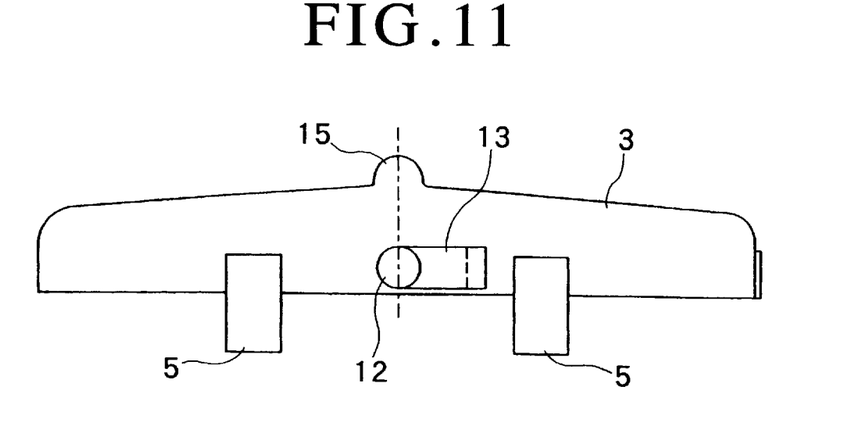
FIG. 11 is a side view of a pressing member showing a third preferred embodiment of a resilient engagement member in the IC pressing member.
Figure 12:
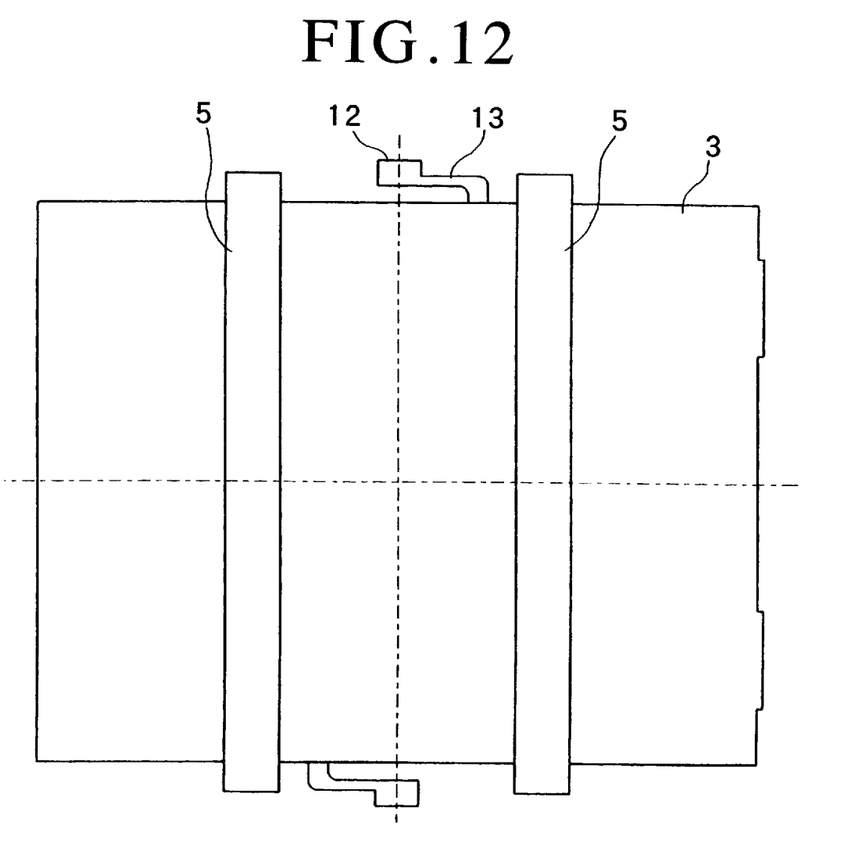
FIG. 12 is a plan view showing the pressing member of FIG. 11.
Figure 15:
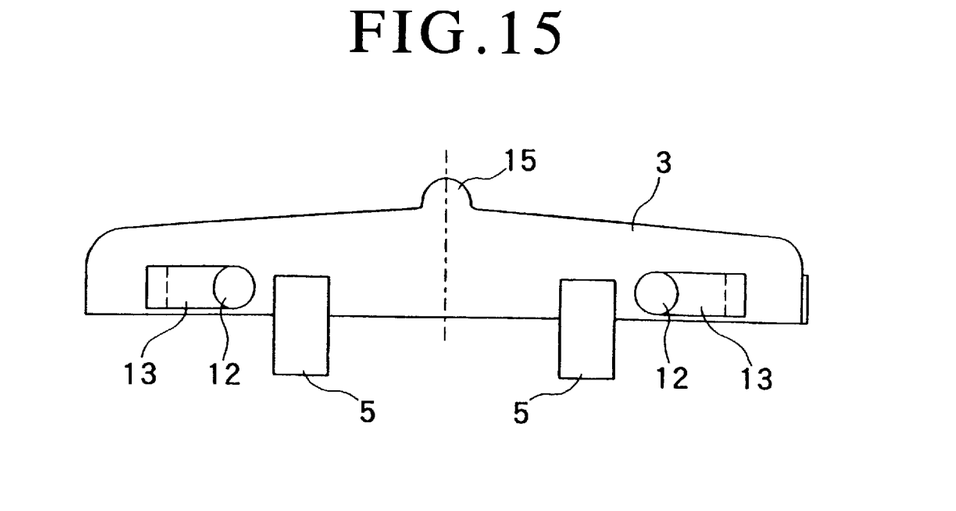
FIG. 15 is a side view of a pressing member showing a fourth preferred embodiment of a resilient engagement mechanism in the IC pressing member.
Figure 16:
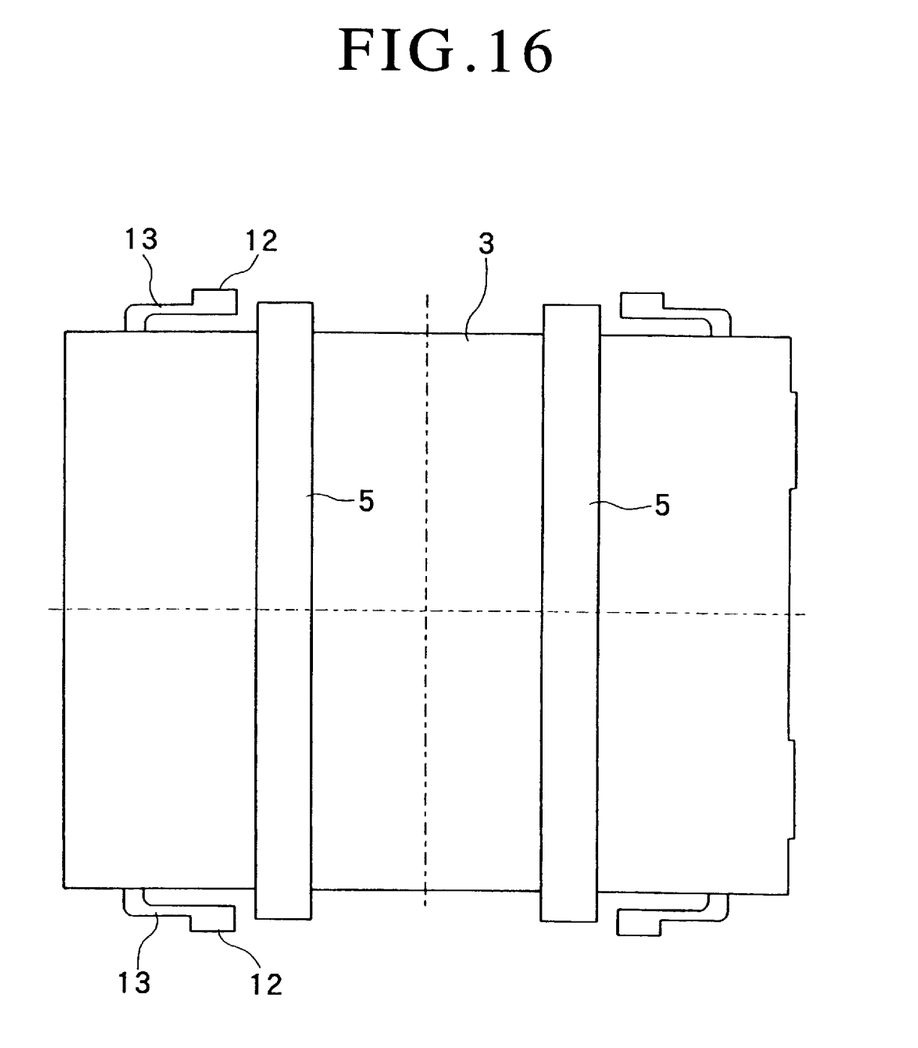
FIG. 16 is a plan view showing the pressing member of FIG. 15.
Figure 17:
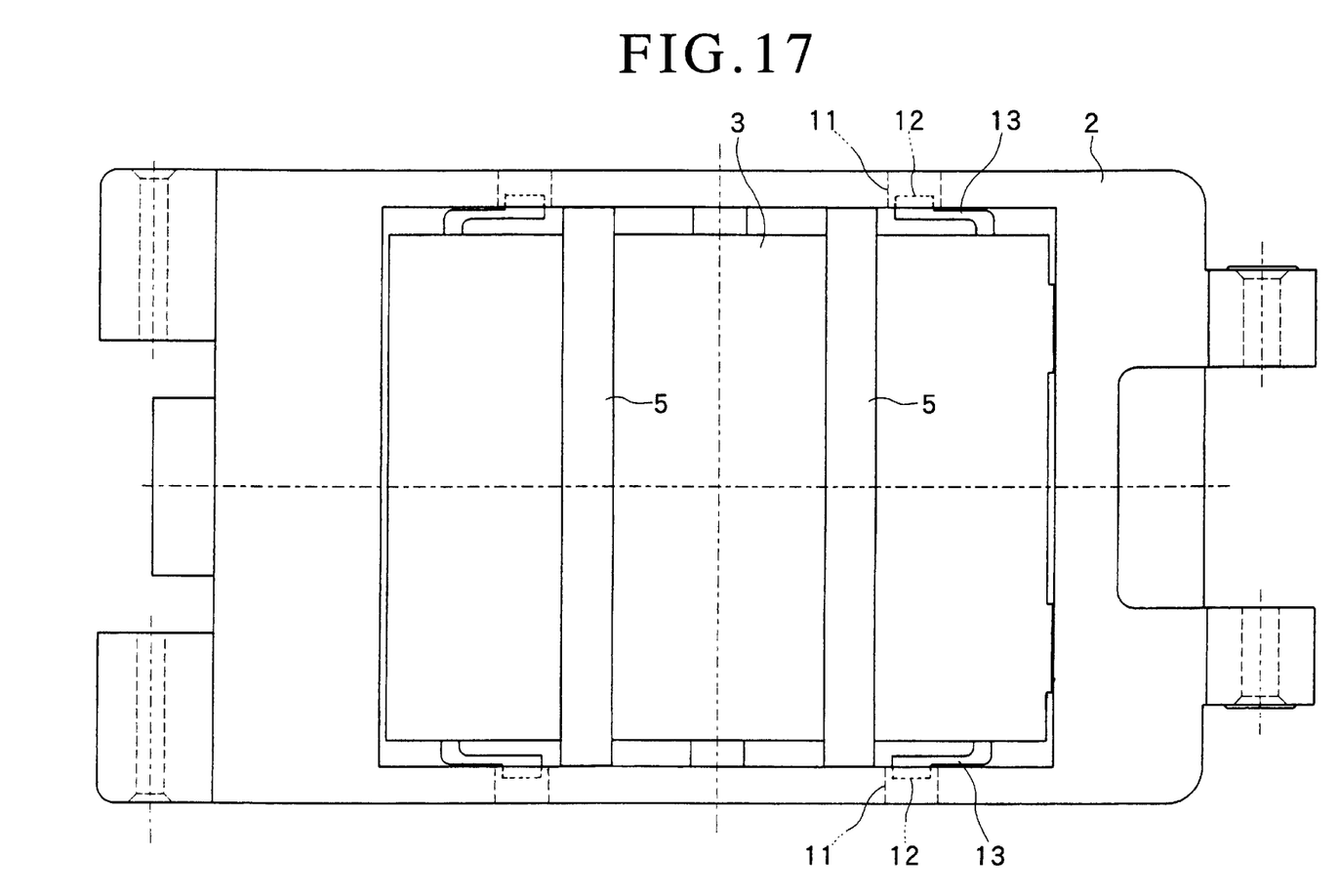
FIG. 17 is a plan view showing an assembled state of the pressing member and the presser cover of FIG 15.
Figure 18:
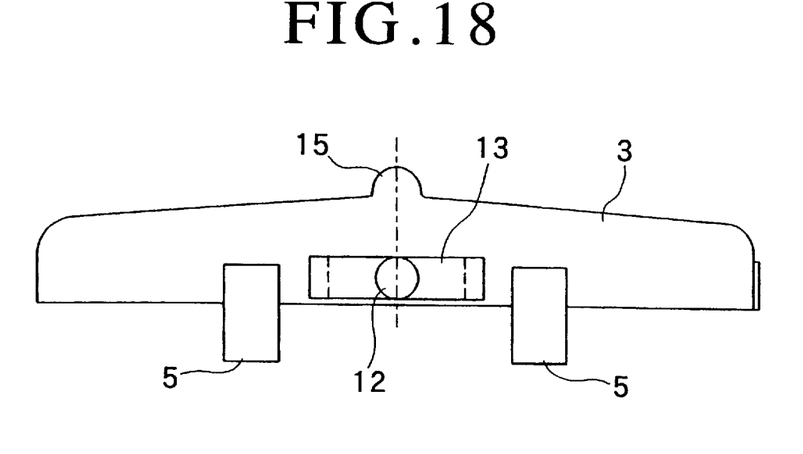
FIG. 18 is a side view of the pressing member showing a fifth preferred embodiment of a resilient engagement mechanism in the IC pressing member.
Figure 19:
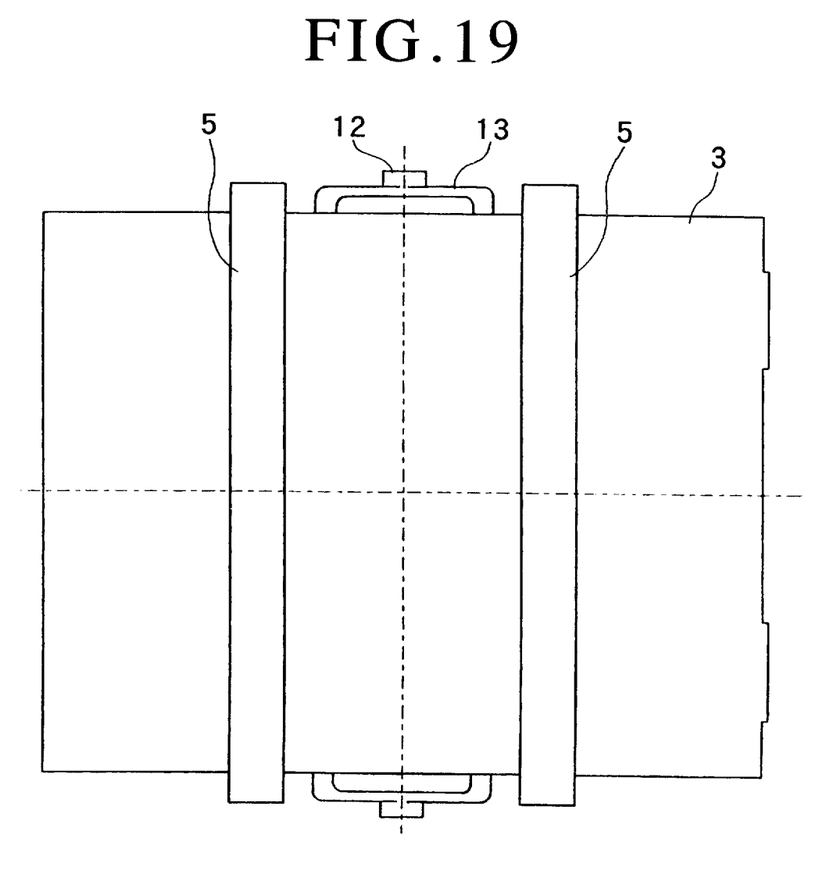
FIG. 19 is a plan view showing the pressing member of FIG. 18.

FIGS. 4 through 7 (first embodiment), FIGS. 8 through 10 (second embodiment), FIGS. 11 through 14 (third embodiment), FIGS. 15 through 17 (fourth embodiment), and FIGS. 18 and 19 (fifth embodiment) exemplify snap preventive mechanisms as examples of the resilient engagement mechanism.

More specifically, the IC pressing member 3 is provided on each of opposite side surfaces thereof with the projections 12 removably fitted into corresponding recesses 11 formed in the pressing member 3, and the presser cover 2 and the pressing member 3 are assembled.

Each projection 12 projects from an outer surface of a cantilever resilient support piece 13, a basal portion of which is connected by integral-molding to a side surface of the IC pressing member 3, so that the projection 12 can be resiliently removably fitted into the recess 11. The so-called snap preventive mechanism is formed by this arrangement.

As a construction common to the first through fifth embodiments, a cantilever or dual-supported type resilient support piece 13 having resiliently flexing properties is designed to project from each of opposite side surfaces of the IC pressing member 3. The resilient support pieces 13 are symmetrically arranged on the opposing sides surfaces of the IC pressing member 3. Each projects 12 is integral with and projecting from the outer surface of the free end portion of the resilient support piece 13.

On the other hand, the presser cover 2 is provided with the pressing member receiving portion 14 which is open on the inner surface side, and the pressing member receiving portion 14 is provided in the inner surface with the recess 11 into which the projection 12 supported by the cantilever resilient support piece 13 can be removably fitted. The IC pressing member 3 is forced into the pressing member receiving portion 14 and the projection 12 is resiliently engaged in the recess 11.

That is; when the pressing member 3 is pushed into the pressing member receiving portion 14, the resilient support piece 13 is inwardly displaced against resiliency by the inner surface of the receiving portion 14, and when the projection 12 supported by the resilient support piece 13 is faced with the recess 11, the projection 12 is resiliently engaged in the recess 11 due to outward displacement by a restoring force of the resilient piece 13. Thus, the IC pressing member is secured to the presser cover by a snap engagement. This snap engagement is facilitated by the shape of the projections 12 illustrated in FIGS. 5 and 14. That is, each of the projections 12 has a ramp-shaped portion so that an initial part of the process of inserting the IC pressing member into the presser cover causes the projection to be flexed inwardly, and when the projection reaches the recess 11, the projection is allowed to flex (or snap) back to its normal state to engage in the recess.

The projection 12 is loosely fitted into the recess 11 so that a required degree of play is left within the recess 11. As a consequence, the pressing member 3 is allowed to rotate. For removing the pressing member 3 from the presser cover 2, the projection is caused to escape from the recess 11 by applying a tensile force to the pressing member 3.

In FIGS. 4 through 7 (first embodiment), the resilient support piece 13 and the projection 12 are arranged on the central portion of each opposing side surface of the pressing member 3 (i.e., the side surface of the central portion where the pivotal support point of the pressing member 3 exists). The resilient support piece 13 is connected at its basal end to the side surface of the pressing member 3 and extends vertically downwardly along the side surface of the pressing member 3 from this connecting end. The projection 12 is integral with and projects from the outer side surface of the free end portion (lower end portion) of the resilient support piece 13. The projection 12 is resiliently fitted in the recess 11 of the IC presser cover 2 so that it can resiliently escape from the recess 11.

The first embodiment exemplifies a resilient engagement mechanism comprising the resilient support piece 13 and the projection 12 and discloses an idea that the resilient engagement mechanism is disposed at a central portion of the side surface of the pressing cover 2 and a pivotal support point (as later described) of the presser cover 2 exists on an upper portion of the resilient engagement mechanism. That is, the connecting end as a resilient displacement support point of the resilient support piece 13 exists immediately under the pivotal support point of the cover 2.

Next, in FIGS. 8 through 10 (second embodiment), two resilient engagement mechanisms, each comprising the vertically extending resilient support piece 13 and the projection 12, are arranged on each of the opposite side surfaces of the pressing member 3.

As one concrete example, the resilient support pieces 13 forming the resilient engagement mechanisms are symmetrically arranged with reference to the pivotal support point of the presser cover 2, and the projection 12 is formed on a lower end of each resilient support piece 13. Two recesses 11 are formed in each of the opposite side surfaces of the receiving portion 14. Owing to this arrangement, by pushing the pressing member 3 into the receiving portion 14, the projections 12 can be resiliently engaged in the corresponding recesses 11.

In the first and second embodiments, the pressing pads 5 extend along the array of the IC leads 7 in parallel relation, with opposite ends thereof allowed to project from opposite side surfaces of the pressing member 3. End faces of the projecting portions 5a of the pressing pads 5 are in contact with or proximate to the opposite inner side surfaces of the pressing member receiving portion 14, so that the pressing member 3 is prevented from swaying leftwardly and rightwardly (in the direction of the array of the leads). Accordingly, the opposite end portions of the pressing pad 5 defines restriction means 5a for restricting the movement of the pressing member 3 in the direction of the array of the leads, in other words, in the direction of the pivotal axis of the pressing member 3.

Next, in FIGS. 11 through 14, the pressing member 3 is provided on each of the opposite side surfaces with a resilient engagement mechanism comprising a resilient support piece 13 and a projection 12. Each of the resilient pieces 13 extends laterally along the side surface of the pressing member 11, and a projection 12 projecting from an outer surface of its distal end portion is disposed at a central portion where the pivotal support point of the pressing member 3 is disposed.

Figure 13:
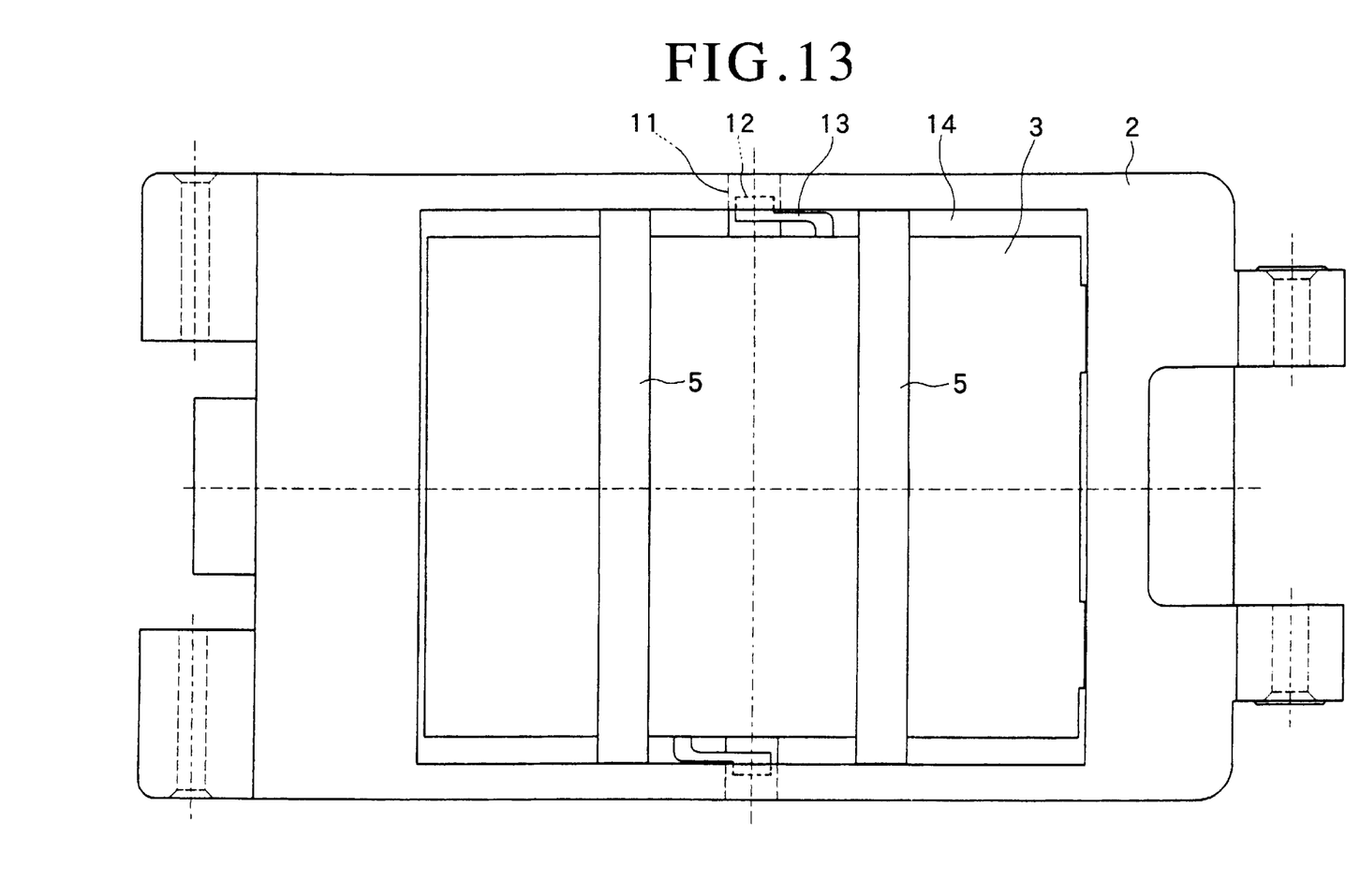
FIG. 13 is a plan view showing an assembled state of the pressing member and the presser cover of FIG. 11.
Figure 14:
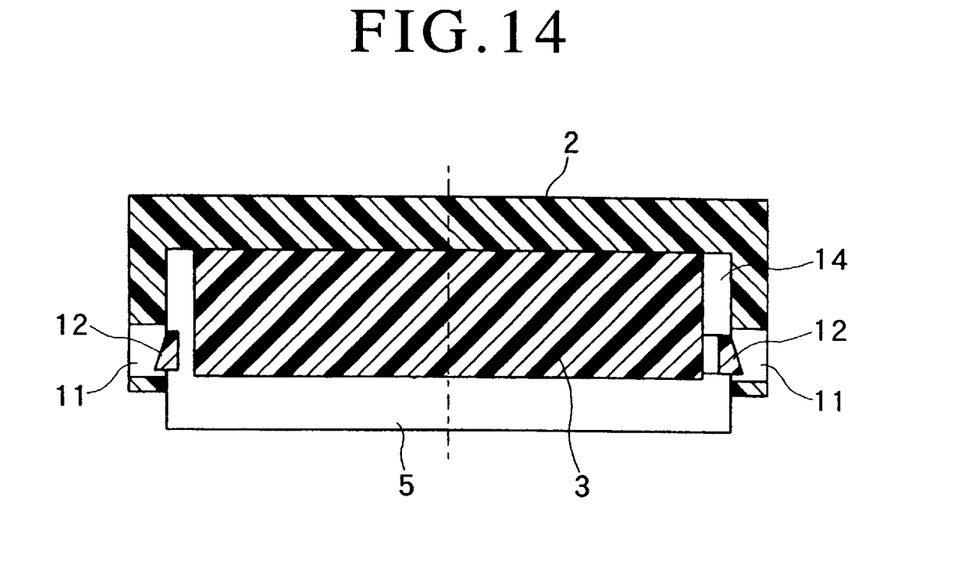
FIG. 14 is a sectional view showing an assembled state of the pressing member and the presser cover.

As described above, the pin portion 15 acting as a pivotal support point is disposed at a central portion of the upper surface of the pressing member 3 and the projection 12 is disposed immediately under the pin portion 15 (on a line perpendicular to the pivot axis of the pressing member 3). The resilient support piece 13 and the projection 12 disposed on one side surface of the pressing member 3 and the counterparts disposed on the other side surface are in a reverse arrangement as shown in FIG. 13. The foregoing embodiment is effective for making the pressing member 3 thinner in design.

Next, FIGS. 14 through 17 (fourth embodiment) show an example in which two resilient engagement mechanisms, each comprising the laterally arranged resilient support piece 13 and the projection 12, are arranged on each of the opposite side surfaces of the pressing member 3, as in the third embodiment.

Further, as a concrete example, the resilient engagement mechanisms, as in the second embodiment, are symmetrically arranged with respect to the pivotal support point of the pressing member 3. The resilient support piece 13 on one side surface extends in a lateral direction and the resilient support piece 13 on the other side surface likewise extends in a lateral direction but in the opposite direction. A free end portion of each of the resilient support pieces 13 has a projection 12 projecting outwardly. In this embodiment, the free ends of the resilient support pieces 13 face inwardly toward each other.

Lastly, FIGS. 18 and 19 (fifth embodiment) show an example in which the pressing member 3 is provided on a central portion of each of opposite side surfaces thereof with the projection 12. The projection 12 projects from a central portion of the outer side surface of a dual-supporting resilient support piece 13.

The resilient support piece 13 extends laterally along the side surface of the pressing member 3 with opposite ends thereof jointly connected to the side surface, to thereby form a dual-supporting construction. The projection 12 is integral with a central portion of the dual-supporting resilient support piece 13. The projecting position of the projection 12 is disposed at a central portion of the side surface of the pressing member 3.

The projection 12 can be linearly reciprocally moved between an engagement position and an engagement-releasing position by resiliency of the dual-supporting resilient support piece 13. Accordingly, an arcuate motion, as in the cantilever resilient support piece, does not occur. Preferably, a distance from the connecting portion of one end of the dual-supporting resilient piece 13 to the projection 12 is equal to a distance from the connecting portion of the other end of the dual-supporting resilient piece 13 to the projection 12.

As one actually-applied example of the fifth embodiment, it may be designed such that the dual-supporting resilient support piece 13 is arranged, as in the first embodiment, in a vertical direction (on a vertical line passing the pivotal support point of the pressing member 3) and the projection 12 is disposed at a central portion of the side surface of the pressing member 3.

In the alternative, a single or a plurality of the projections 12 of the dual-supporting resilient support piece 12 can be disposed at areas other than the central portion.

The pressing pads 5 of the pressing member 3 and the pin portion 15 extend parallel to the pivotal pin 4 of the presser cover 2.

The pin portion 15 of the pressing member 3 can be replaced by a universal joint (for example, a ball joint). That is, in FIG. 2, as well as elsewhere, the pin portion 15 comprises a semi-spherical projection, and the bearing portion 16 comprises a semi-spherical hole. By slidingly fitting the semi-spherical projection into the semi-spherical hole, a universal support point can be formed.

In the first through fifth embodiments, the pressing member 3 is pivotally or linearly moved to self-adjust its pressing attitude with respect to the leads 7. However, the present invention can be practiced as an arrangement for facilitating assembly of the pressing member 3, which is formed of a separate part from the presser cover 2, with the receiving portion in such a way to not rotate (i.e., to not self-adjust).

That is, even in the event the pressing member 3 does not rotate, the present invention has the advantage that assembling and removal of the pressing member 3 can be easily carried out with respect to the presser cover 2.

In case the pressing member 3 of the resilient engagement mechanism shown in the first through fifth embodiments is of a self-adjusting construction, a loosely fitting construction for allowing such a self-adjusting motion is designed. In case the pressing member 3 is not of such a self-adjusting construction, it is designed such that the projection 12 is as very tightly fitted into the recess 11 as possible.

In contrast, as another actually applied example of the embodiments of the present invention, it may be designed such that there is no provision of the pin portion 15 to be removably slidingly fitted and the bearing portion 16, and the projection 12 is loosely fitted into the recess 11 to provide a self-adjusting action of the pressing member 3. In this case, the projection 12 and the recess 11 are preferably designed to have a circular configuration in section and to be different in diameter.

Figure 5:
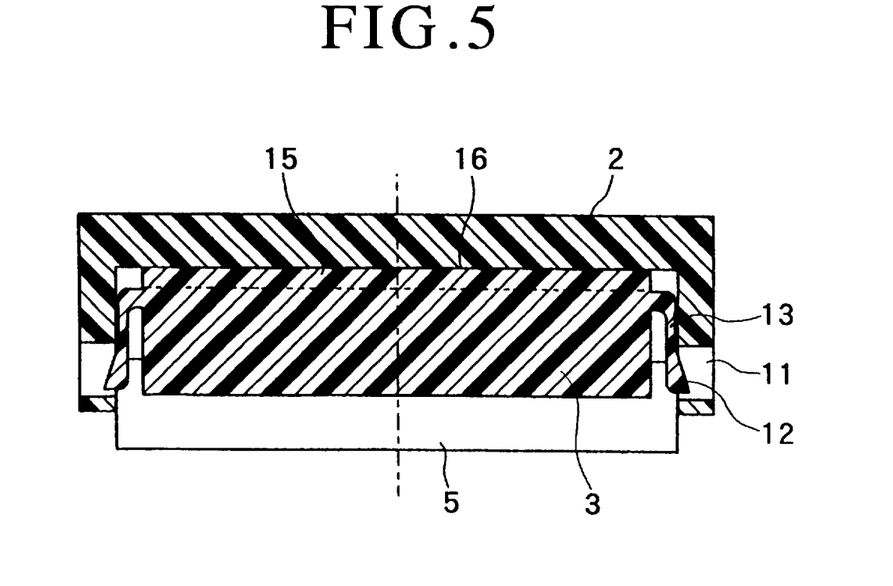
FIG. 5 is a sectional view showing an assembly of the IC presser cover and the IC pressing member in the IC socket.
Figure 6:
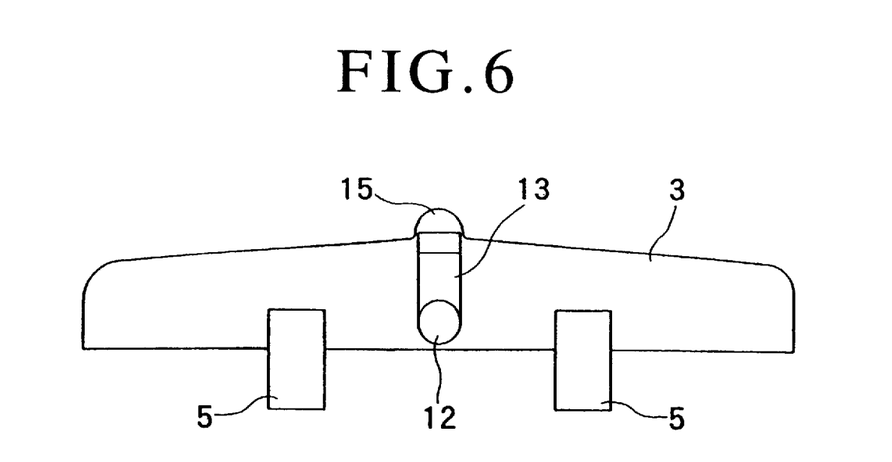
FIG. 6 is a side view of the IC pressing member.
Figure 7:
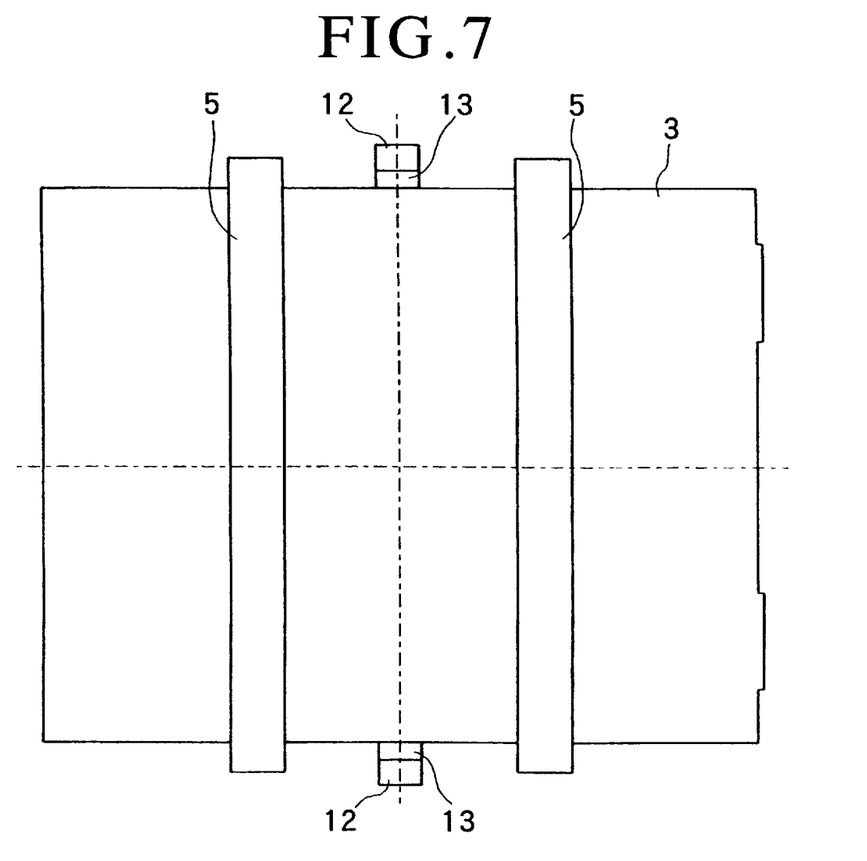
FIG. 7 is a plan view showing the pressing member.

As shown in FIG. 5, as well as elsewhere, the recess 11 comprises a through-hole extending through a side wall which defines the receiving portion 14. A tip of a tool is pushed into the through-hole from outside in order to facilitate an easy removal of the projection 12 from the recess 11.

Owing to the arrangement hereinbefore described, the pressing member can easily be assembled and removed. Thus, assembling performance is good. Moreover, the pressing pad can easily be replaced when worn. As a result, the IC socket can reliably function for a long period of time.

Although the present invention has been described in its preferred form with a certain degree of particularity, it should be understood that the present disclosure of the preferred form has been made only by way of example and that numerous changes in the details of construction and arrangement of parts may be resorted to without departing from the spirit and the scope of the invention as hereinafter claimed.

What is claimed is:

1. An IC socket for use with an IC package having an IC body and IC leads, said IC socket comprising:
    a socket body having an IC receiving portion adapted to receive the IC package, and contacts adapted to be contacted by the IC leads;
    a presser cover provided on said socket body for movement between a closed position, in which said presser cover is closed over said socket body, and an open position;
    an IC pressing member disengageably attached to said presser cover by a resilient engagement mechanism so as to press against the IC package when the IC package is received in said IC receiving portion and said presser cover is in said closed position;
    wherein said resilient engagement mechanism comprises first engagement parts of one of said presser cover and said IC pressing member, and second engagement parts of the other of said presser cover and said IC pressing member; and
    wherein said second engagement parts are resiliently engageable with said first engagement parts, respectively, such that said second engagement parts can be resiliently flexed to be engaged with and disengaged from said first engagement parts, respectively.

2. An IC socket as recited in claim 1, wherein
said first engagement parts respectively comprise recesses formed in said presser cover on opposite sides of said IC pressing member; and
said second engagement parts respectively comprise resiliently flexible projections projecting from opposite sides of said IC pressing member for engagement in said recesses.

3. An IC socket as recited in claim 2, wherein
said IC pressing member, when attached to said presser cover, extends in a plane generally parallel to said presser cover; and
said resiliently flexible projections comprise two resiliently flexible projections respectively provided at centers of said opposite sides of said IC pressing member with respect to a direction parallel to said plane.

4. An IC socket as recited in claim 3, wherein
said IC pressing member is disengageably attached to said presser cover so as to be movable relative to said presser cover.

5. An IC socket as recited in claim 3, wherein
said IC pressing member is disengageably attached to said presser cover so as to be pivotal relative to said presser cover about a pivot axis defined by a fulcrum mechanism.

6. An IC socket as recited in claim 5, wherein
said fulcrum mechanism comprises a rib portion of said IC pressing member which projects toward said presser cover, and a bearing portion of said presser cover which faces said IC pressing member and receives said rib portion.

7. An IC socket as recited in claim 3, wherein
each of said projections is resiliently flexibly attached to said IC pressing member by a dual-supporting resilient support piece attached to said IC pressing member at two attachment locations.

8. An IC socket as recited in claim 3, wherein
each of said projections is resiliently flexibly attached to said IC pressing member by a cantilever resilient support piece attached to said IC pressing member at a single attachment location.

9. An IC socket as recited in claim 8, wherein
for each of said cantilever resilient support pieces, said single attachment location is offset from a center of said projection which it attaches to said IC pressing member, in a direction parallel to said plane.

10. An IC socket as recited in claim 8, wherein
for each of said cantilever resilient support pieces, said single attachment location is offset from a center of said projection which it attaches to said IC pressing member, in a direction normal to said plane.

11. An IC socket as recited in claim 2, wherein
said IC pressing member, when attached to said presser cover, extends in a plane generally parallel to said presser cover;
said resiliently flexible projections comprise two pairs of resiliently flexible projections, each pair of said resiliently flexible projections being provided on a side of said IC pressing member opposite the other pair of said resiliently flexible projections; and
said resiliently flexible projections of each said pair of said resiliently flexible projections are provided on opposite sides of a center of the respective side of said IC pressing member with respect to a direction parallel to said plane.

12. An IC socket as recited in claim 11, wherein
said IC pressing member is disengageably attached to said presser cover so as to be movable relative to said presser cover.

13. An IC socket as recited in claim 11, wherein
said IC pressing member is disengageably attached to said presser cover so as to be pivotal relative to said presser cover about a pivot axis defined by a fulcrum mechanism.

14. An IC socket as recited in claim 13, wherein
said fulcrum mechanism comprises a rib portion of said IC pressing member which projects toward said presser cover, and a bearing portion of said presser cover which faces said IC pressing member and receives said rib portion.

15. An IC socket as recited in claim 11, wherein
each of said projections is resiliently flexibly attached to said IC pressing member by a cantilever resilient support piece attached to said IC pressing member at a single attachment location.

16. An IC socket as recited in claim 15, wherein
for each of said cantilever resilient support pieces, said single attachment location is offset from a center of said projection which it attaches to said IC pressing member, in a direction parallel to said plane.

17. An IC socket as recited in claim 15, wherein
for each of said cantilever resilient support pieces, said single attachment location is offset from a center of said projection which it attaches to said IC pressing member, in a direction normal to said plane.

18. An IC socket for use with an IC package having an IC body and IC leads, said IC socket comprising:
a socket body having an IC receiving portion adapted to receive the IC package, and contacts adapted to be contacted by the IC leads;
a presser cover provided on said socket body for movement between a closed position, in which said presser cover is closed over said socket body, and an open position;
an IC pressing member disengageably attached to said presser cover by a resilient engagement mechanism so as to press against the IC package when the IC package is received in said IC receiving portion and said presser cover is in said closed position;
wherein said resilient engagement mechanism comprises first engagement parts of one of said presser cover and said IC pressing member, and second engagement parts of the other of said presser cover and said IC pressing member;
wherein said second engagement parts comprise resiliently flexible projections, and said first engagement parts comprise recesses into which said resiliently flexible projections are engageable; and
wherein said resiliently flexible projections respectively have ramp portions for causing flexing of said projections away from said recesses when said IC pressing member is being initially moved toward an engaged position with said presser cover and, when said projections become respectively aligned with said recesses, for allowing said projections to flex back toward said recesses, respectively, so as to snap into engagement in said recesses.

19. An IC socket as recited in claim 18, wherein
said IC pressing member, when attached to said presser cover, extends in a plane generally parallel to said presser cover; and
said resiliently flexible projections comprise two resiliently flexible projections respectively provided at centers of said opposite sides of said IC pressing member with respect to a direction parallel to said plane.

20. An IC socket as recited in claim 19, wherein
each of said projections is resiliently flexibly attached to said IC pressing member by a dual-supporting resilient support piece attached to said IC pressing member at two attachment locations.

21. An IC socket as recited in claim 19, wherein
each of said projections is resiliently flexibly attached to said IC pressing member by a cantilever resilient support piece attached to said IC pressing member at a single attachment location.

22. An IC socket as recited in claim 21, wherein
for each of said cantilever resilient support pieces, said single attachment location is offset from a center of said projection which it attaches to said IC pressing member, in a direction parallel to said plane.

23. An IC socket as recited in claim 21, wherein
for each of said cantilever resilient support pieces, said single attachment location is offset from a center of said projection which it attaches to said IC pressing member, in a direction normal to said plane.

24. An IC socket as recited in claim 18, wherein
said IC pressing member, when attached to said presser cover, extends in a plane generally parallel to said presser cover;
said resiliently flexible projections comprise two pairs of resiliently flexible projections, each pair of said resiliently flexible projections being provided on a side of said IC pressing member opposite the other pair of said resiliently flexible projections; and
said resiliently flexible projections of each said pair of said resiliently flexible projections are provided on opposite sides of a center of the respective side of said IC pressing member with respect to a direction parallel to said plane.

25. An IC socket as recited in claim 24, wherein
each of said projections is resiliently flexibly attached to said IC pressing member by a cantilever resilient support piece attached to said IC pressing member at a single attachment location.

26. An IC socket as recited in claim 25, wherein
for each of said cantilever-resilient support pieces, said single attachment location is offset from a center of said projection which it attaches to said IC pressing member, in a direction parallel to said plane.

27. An IC socket as recited in claim 25, wherein
for each of said cantilever resilient support pieces, said single attachment location is offset from a center of said projection which it attaches to said IC pressing member, in a direction normal to said plane.

* * * * *